(12) United States Patent
Ahn

(10) Patent No.: US 10,482,387 B2
(45) Date of Patent: *Nov. 19, 2019

(54) QUANTUM MECHANICAL MACHINE VISION SYSTEM AND ARITHMETIC OPERATION METHOD BASED ON ORBITAL QUBIT

(71) Applicant: University of Seoul Industry Cooperation Foundation, Seoul (KR)

(72) Inventor: Do Yeol Ahn, Seoul (KR)

(73) Assignee: UNIVERSITY OF SEOUL INDUSTRY COOPERATION FOUNDATION, Seoul (KR)

( * ) Notice: Subject to any disclaimer, the term of this patent is extended or adjusted under 35 U.S.C. 154(b) by 212 days.

This patent is subject to a terminal disclaimer.

(21) Appl. No.: 15/838,612

(22) Filed: Dec. 12, 2017

(65) Prior Publication Data
US 2018/0165595 A1 Jun. 14, 2018

(30) Foreign Application Priority Data
Dec. 12, 2016 (KR) .................. 10-2016-0168245

(51) Int. Cl.
*G06N 10/00* (2019.01)
*G06K 9/62* (2006.01)
(Continued)

(52) U.S. Cl.
CPC ............. *G06N 10/00* (2019.01); *G06F 17/11* (2013.01); *G06K 9/6202* (2013.01); *G06K 9/66* (2013.01); *G06N 20/00* (2019.01)

(58) Field of Classification Search
CPC ........ G06K 9/6202; G06K 9/66; G06N 10/00; G06N 20/00; G06F 17/11
See application file for complete search history.

(56) References Cited

U.S. PATENT DOCUMENTS 8,504,497 B2 8/2013 Amin
2018/0165594 A1* 6/2018 Ahn .................. G06K 9/56

FOREIGN PATENT DOCUMENTS

KR 10-1309677 9/2013

OTHER PUBLICATIONS

Federico Spedalieri "Overcoming limitations of quantum annealers" QuAASI'16 (Year: 2016).*
(Continued)

*Primary Examiner* — Leon Flores
(74) *Attorney, Agent, or Firm* — Kile Park Reed & Houtteman PLLC

(57) ABSTRACT

A quantum mechanical arithmetic operation method for machine vision, based on orbital qubit is performed by a quantum processing processor. The quantum mechanical arithmetic operation method comprises, obtaining a first labeled graph connecting between feature points of the first image and a second labeled graph connecting feature points of the second image, generating a point-to-point combination by matching the feature points of the first image with the feature points the second image, generating a conflict graph by adding the largest point-to-point combination by comparing the point-to-point combinations with the threshold, generating non-constrained binary optimization equation for finding a maximum independent set of conflict graphs, converting the non-constrained binary optimization equation into Ising model of the quantum system, and calculating the Hamiltonian of Ising model based on an orbital qubit to obtain solution of the non-constrained binary optimization equation.

9 Claims, 7 Drawing Sheets

(51) Int. Cl.
*G06F 17/11* (2006.01)
*G06K 9/66* (2006.01)
*G06N 20/00* (2019.01)

(56) References Cited

OTHER PUBLICATIONS

Hartmut Neven et al., "Image recognition with an adiabatic quantum computer I. Mapping to quadratic unconstrained binary optimization." arXiv:0804.4457v1 [quant-ph]; Apr. 28, 2008; pp. 1-7.
Marco De Michielis et al. "Geometrical Effects on Valley-Orbital Filling Patterns in Silicon Quantum Dots for Robust Qubit Implementation" Applied Physics Express 5 (2012) 124001; pp. 124001-1-124001-3.
Hartmut Neven et al., "QBoost: Large Scale Classifier Training with Adiabatic Quantum Optimization."; JMLR: Workshop and Conference Proceedings 25; 2012; Asian Conference on Machine Learning; pp. 333-348.
Peter W. Shor, "Introduction to Quantum Algorithms", arXiv:quant-ph/0005003v2; Jul. 6, 2001; pp. 1-17.
Michael A. Nielsen et al., "Quantum Computation and Quantum Information"; 10th Anniversary Edition, 2010, Cambridge University Press, pp. 1-698.

* cited by examiner

Image A

Image B

QUANTUM MECHANICAL MACHINE VISION SYSTEM AND ARITHMETIC OPERATION METHOD BASED ON ORBITAL QUBIT

CROSS REFERENCE TO RELATED APPLICATION

This application claims priority from and the benefit of Korean Patent Applications No. 10-2016-0168245, filed on Dec. 12, 2016, which is hereby incorporated by reference for all purposes as if fully set forth herein.

BACKGROUND OF THE INVENTION

Field of the Invention

The present invention relates to a quantum mechanical machine vision system and an arithmetic operation method, more specifically to a quantum mechanical machine vision system and an arithmetic operation method based on orbital qubit.

Discussion of the Background

Human beings now have better analytical capabilities than machine analysis in many areas such as object recognition, knowledge representation, reasoning, learning and natural language processing. Accordingly, in order to imitate or surpass the human way of thinking mechanically, a complicated arithmetic operation method must be used.

An accurate solution to the problem of optimization of machine vision system is required to imitate or surpass human visual recognition ability as an example.

In order to solve the complex computation method of artificial view, there is a method of performing quantum mechanical calculation using quantum computing.

A quantum computer is a physical system that uses one or more quantum effects to perform calculations. A quantum computer capable of efficiently simulating other quantum computers is called a universal quantum computer (UQC).

1. Approach to Quantum Computation

There are several general approaches to the design and operation of quantum computers.

One approach corresponds to a 'circuit model' of quantum computation. In this approach, qubits operate in the order of a logical gate, which is a representation of a compiled algorithm. Circuit model quantum computers have some serious barriers in their actual implementation. In a circuit model, qubits are required to be coherent for a longer period of time than a single-gate time. This demand arises because circuit model quantum computers require operations, called quantum error correction, to operate. Quantum error correction cannot be performed without the qubit of a circuit model quantum computer that can maintain quantum coherence for a time interval of about 1000 times one gate time. There have been a number of studies focused on developing qubits with sufficient coherence to form basic information units of quantum computers. This is described in, for example, "Introduction to Quantum Algorithms", by Shor, P. W. arXiv. org: quantph/0005003 (2001), pp. 1-27. This technical field is still stagnant due to the lack of the ability to enhance the coherence of the qubit to a level suitable for designing and operating real circuit model quantum computers.

2. Computational Complexity Theory

In computer science, computational complexity theory is a kind of computational theory required to solve a given computational problem and the theory of computation to study resources or costs. Costs are generally measured by abstract parameters called computational resources, such as time and space. The time means the number of steps necessary to solve the problem, and the space means the required amount of information storage or the amount of memory required.

Optimization problems correspond to problems where one or more objective functions are minimized and maximized under a set of constraints, sometimes with respect to a set of variables.

Simulation problems typically deal with the simulation of one system by another system during a typical time interval. For example, computer simulations consist of business processes, ecological habitats, protein folding, molecular ground states, and quantum systems. These problems often involve numerous diverse entities that are different from complex inter-relationships and behavioral rules. Feynman suggests that a quantum system can be used to simulate several physical systems more efficiently than UTM.

Many optimization and simulation problems cannot be solved using UTM. Because of these limitations, computational elements are needed that can solve computational problems beyond the scope of the UTM. Other digital computer based systems and methods for solving optimization problems can be found.

An example of a technique for solving this optimization problem is described in Korean Patent No. 10-1309677 entitled 'Method for Calculating Adoptive Quantum'.

The prior art discloses a quantum computing method using a quantum system that includes a plurality of qubits. In the prior art, quantum annealing is possible to obtain a desired minimum energy (or cost), which concurrently tracks a configuration of a superposition state, and especially, Adiabatic Quantum Computation (AQC) technique is used to perform quantum annealing. In addition, AQC uses a technique in which an adiabatic change of Hamiltonian from the initial state to the target state is obtained and a solution of the desired target state is finally obtained.

The above prior art describes the general operation of a quantum computing system to solve a complex problem, and in spite of the existence of this prior art, the selection of an optimized quantum system remains a very important problem to solve the complicated matter.

SUMMARY OF THE INVENTION

Accordingly, it is an object of the present invention to provide a quantum mechanical machine vision system and an arithmetic operation method based on orbital qubit, which can facilitate calculation of complexity caused by an increase in the number of feature points for image identification.

A quantum mechanical arithmetic operation method based on orbital qubit according to an exemplary embodiment of the present invention is performed by a quantum processing processor. The quantum mechanical arithmetic operation method comprises, obtaining a first labeled graph connecting between feature points of the first image and a second labeled graph connecting feature points of the second image, generating a point-to-point combination by matching the feature points of the first image with the feature points the second image, generating a conflict graph by adding the largest point-to-point combination by comparing the point-to-point combinations with the threshold, generating non-constrained binary optimization equation for finding a maximum independent set of conflict graphs, converting the non-constrained binary optimization equation into Ising model of the quantum system, and calculating the Hamiltonian of Ising model based on an orbital qubit to obtain solution of the non-constrained binary optimization equation.

For example, calculating the Hamiltonian of Ising model based on orbital qubit to obtain solution of the non-constrained binary optimization equation may be performed by two eigenstate in six eigenstates in the minimum conduction band of silicon (Si) crystal, the two eigenstate being opposite to each other.

In this case, the two eigenstate may be along a [001] direction of silicon crystal.

For example, the Hamiltonian of the Ising model may be calculated through adiabatic evolve, in calculating the Hamiltonian of Ising model based on an orbital qubit to obtain solution of the non-constrained binary optimization equation.

On the other hand, the quantum mechanical arithmetic operation method may further comprise repeatedly learning the non-constrained binary optimization equation through machine learning.

A quantum mechanical machine vision system according to an exemplary embodiment of the present invention comprises an image acquisition module, a quantum processing processor and a memory unit. The image acquisition module acquires an image. The quantum processing processor processes the image obtained from the image acquisition module. The memory unit stores data necessary for computation of the quantum processing processor. The quantum processing processor obtains a first labeled graph connecting between feature points of the first image and a second labeled graph connecting feature points of the second image, generates a point-to-point combination by matching the feature points of the first image with the feature points the second image, generates a conflict graph by adding the largest point-to-point combination by comparing the point-to-point combinations with the threshold, generates non-constrained binary optimization equation for finding a maximum independent set of conflict graphs, converts the non-constrained binary optimization equation into Ising model of the quantum system, and calculates the Hamiltonian of Ising model based on an orbital qubit to obtain solution of the non-constrained binary optimization equation.

For example, the quantum processing processor may use two eigenstate in six eigenstates in the minimum conduction band of silicon (Si) crystal, the two eigenstate being opposite to each other.

For example, the two eigenstate may be along a [001] direction of silicon crystal.

For example, the quantum processing processor may calculate the Hamiltonian of the Ising model through adiabatic evolve.

As described above, according to the orbital qubit-based quantum mechanical machine vision system and an arithmetic operation method of the present invention, the NP problem generated as the number of feature points increases is replaced by Hamiltonian using Ising model, so that it can be easily calculated using orbital qubits arranged in a matrix shape.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
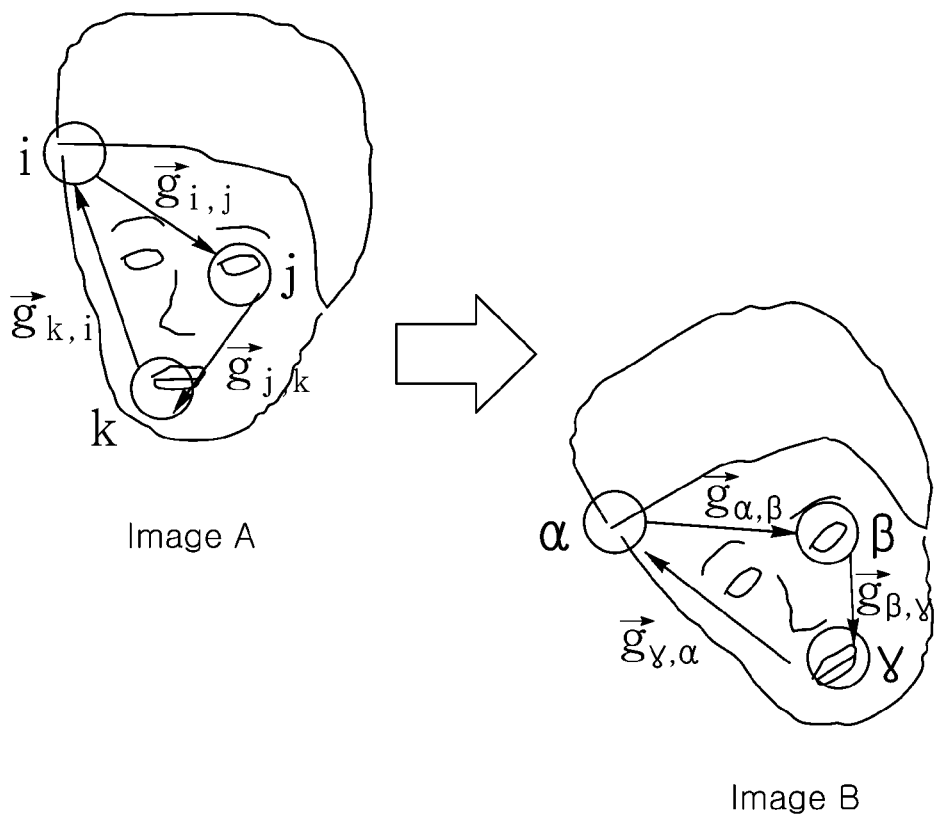
FIG. 1 is a diagram showing a modeling of interrelationships of feature vectors between interest points according to an embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

Hereinafter, exemplary embodiments of the present invention will be described in detail with reference to the accompanying drawings.

FIG. 1 is a diagram showing a modeling of interrelationships of feature vectors between interest points according to an embodiment of the present invention.

In the machine vision system, the computer or the robot compares the previously captured reference pattern with the photographed image to recognize the image, and this process is advanced through a training process. In general, an algorithm called a heuristic algorithm is applied to a particular type of image, and a heuristic algorithm can be applied in various ways depending on the image.

Generally, a brain recognizing human visual and visual information extracts feature points that can adequately describe a pattern represented by each image for pattern matching between different images, and the distance and direction between the feature points are synthetically recognized, so that the distance and direction are recognized as a pattern. The human brain then compares the pattern information extracted from the image to determine whether the two images match. This process is difficult by searching only by movement between a point and a point, but easy by obtaining patterns including surrounding points.

However, in machine vision with limited intelligence in general, it is extremely difficult to fully simulate the behavior of human brain or the interpretation of human sensory data. It is known as the NP-Hard Problem to simulate the behavior of the human brain.

In FIG. 1, a process of recognizing a pattern between different images is modeled, and the process is described as a general NP-Hard problem. The images of image A and image B are different images but may be different versions of images having the same physical structure.

In order to perform pattern recognition operations related to machine vision, a combination of feature vectors representing relative position information between respective points of interest (feature points) in each image is used, and a combination of these feature vectors is used as a reference for recognizing each image.

The process of extracting a reference pattern for each image can be performed by a process of extracting feature points and a process of determining relative position information between the feature points as a feature vector. This process is not a deterministic problem, but a non-deterministic problem in which it is necessary to find an optimized value by comparing the results.

Assuming that a reference pattern made up of a set of feature vectors between interest points (feature points) i, j, k in the image A in FIG. 1 is X, and a reference pattern made up of a set of feature vectors between interest points (feature points) α, β, γ in the image B in FIG. 1 is Y, it is difficult to calculate the reference pattern X of image A and the reference pattern Y of image B in FIG. 1.

In order to describe the mapping between the image A and the image B in FIG. 1, a reference pattern X which best describes image A and a reference pattern Y which best describes image B must be obtained, and how the reference pattern X is displaced to the reference pattern Y must be derived through calculation. That is, searching for a relationship describing the mapping between the image A and the image B in FIG. 1 can be regarded as searching for the most optimized combination of the reference pattern X and the reference pattern Y. In the present invention, this process is set as one objective function, and it is considered as an optimization problem in which the objective function is minimized. The optimization problem at this time is known as NP-hard problem as mentioned above.

In the present invention, this optimization problem is solved by using quantum computing, and an arrow representing a connection between respective points of interest (feature points) is modeled as a dipole in an image. In this case, the arrow indicates the direction and length between the respective points of interest (feature points), and may be represented by a vector.

To this end, (i) a term indicating a mismatch between a feature point of the image A and a corresponding position of the feature point of the image B, and (ii) a term indicating spatial consistency between neighboring points can be defined by measuring divergence of matches of the neighboring points.

By utilizing the physical model of quantum computing, the most optimized pattern X in image A and the most optimized pattern Y image B can be found at the same time. By modeling together with a combination of feature vectors between interest points (feature points) i, j, k in the image A and a combination of feature vectors between interest points (feature points) α, β, γ in the image B as a physical model for quantum computing, and by observing the physical model, optimized reference patterns X and Y can be obtained. The optimized state can be obtained by taking the state of the physical model when the energy of the physical model is in the ground state. For example, when a physical model is implemented in a black box capable of quantum computing and physical properties of a physical model in a black box are observed when the target state (ground state) is obtained through an adiabatic evolution process using a physical model, the optimized reference patterns X and Y can be obtained.

At this time, the physical model including the dipole physical characteristics such that the combination of vectors between interest points (feature points) of each image is described by the dipole model can be selected as the physical model in the black box.

In the image A in FIG. 1, a feature vector having the starting point of interest (feature point) i and the ending point of j can be expressed as $\vec{g}_{i,j}$. In this case, the relationship between the points of interest (feature points) i to j includes not only the translation between the feature points but also the difference of the local scale and the orientation. Feature vectors $\vec{g}_{i,j}$ can be normalized for global translation, rotation, and scaling.

When the graph of the feature points i, j, k in image A of FIG. 1 is defined as $G_A$ and the graph of the points of interest (feature points) α, β, γ in image B is defined as $G_B$, following Equation 1 defines the distance between feature points (i∈$G_A$, α∈$G_B$) derived from each image. If the number of feature points in image A is M, the $G_A$ is expressed as a labeled graph having M nodes. If the number of feature points in image B is N, the $G_B$ is represented by a labeled graph having N nodes. Where $\vec{f}_i$ is the normalized feature vector for the $i^{th}$ vertex of the $G_A$ and $\vec{f}_\alpha$ is the normalized feature vector for the $\alpha^{th}$ vertex of $G_B$. The normalized feature vector may also be referred to as a local descriptor depending on the document. For example, the normalized feature vector may be a vector based on Gabor wavelets of varying scale and orientation with varying magnitude and direction around the point of interest. The edges of the graphs $G_A$ and $G_B$ represent the geometric relationships between the feature vectors. Similarity between the image A and the image B in FIG. 1 can be confirmed by finding the similarity between the two labeled graphs $G_A$ and $G_B$.

$$d(i,\alpha)=d_{feature}(\vec{f}_i,\vec{f}_\alpha).$$ [Equation 1]

where d (i, α) is a scalar product between feature vectors $\vec{f}_i$ and $\vec{f}_\alpha$, and d (i, α) can be interpreted as a measure of the similarity of the correlated feature vectors and is a normalized value.

At this time, the combination between the point i obtained in image A and the point α obtained in image B can be defined as (i, α). If we define $T_{feature}$ as a point-wise threshold that indicates whether the combination (i, α) is a potential match suitable for describing the pattern, the combination (i, α) satisfying d (i, α)>$T_{feature}$ can be interpreted as a potential match suitable for describing the image pattern.

The conflict graph $G_C$ can be generated from the graphs $G_A$ and $G_B$ as a measure for measuring the similarity of the graphical representations of image A and image B in FIG. 1. The conflict graph $G_C$ can be generated by sequentially adding possible point-to-point combinations suitable for describing the image pattern, starting from the combination (i, α) having the largest d (i, α) value as the vertex $V_{i\alpha}$ of the conflict graph $G_C$. The process of generating a conflict graph $G_C$ can be repeated until all suitable point-to-point combinations are included.

Edges (i,α;j,β) in the conflict graph $G_C$ encode geometric consistency between $\vec{f}_i$ and $\vec{f}_j$ in the labelled graph $G_A$ corresponding to image A in FIG. 1, and $\vec{f}_\alpha$ and $\vec{f}_\beta$ in the labelled graph $G_B$ corresponding to image B in FIG. 1.

For all vertex pairs $(V_{i\alpha}, V_{j\beta})$ in $G_C$ where $i \neq j$ and $\alpha \neq \beta$ we calculate the geometric consistency of the two pairs of interest points $d(i,\alpha,j,\beta) = d_{geometric}(\vec{g}_{ij}, \vec{g}_{\alpha\beta})$ which is normalized.

The geometric consistency measures the geometric compatibility of the match pairs $(i,\alpha)$ and $(j,\beta)$ as the residual differences in local displacement, scale and rotation assignment of the associated interest points after the changes due to global translation, rotation and scaling have been normalized. A pair $(i,\alpha)$ and $(j,\beta)$ are not allowed to match if they are in geometric conflict, i.e., the residual effects are two large.

If $d(i,\alpha,j,\beta) < T_{geometric}$, the pair $(i,\alpha)$ and $(j,\beta)$ are considered in geometric conflict for a threshold $T_{geometric}$. We draw an edge in $G_C$ between vertex pairs $(V_{i\alpha}, V_{j\beta})$ if $i \neq j$ and $\alpha \neq \beta$ and they in geometric conflict. By this prescription, we draw the conflict graph with at most L vertices. The maximum independent set of the conflict graph is equivalent to the maximum common subgraph of unlabeled graphs $G_A$ and $G_B$.

Finding the maximum independent set for the conflicting graph $G_C$ can be translated as a quadratic unconstrained binary optimization problem defined by following Equation 2.

$$\vec{x}_{opt} = \operatorname{argmin}\left\{\sum_{i\alpha<j\beta}^{N} Q_{i\alpha,j\beta} x_{i\alpha} x_{j\beta}\right\}, x_{i\alpha} \in \{0, 1\}, \quad \text{[Equation 2]}$$

where $Q_{i\alpha,i\alpha} = -1$ for all vertices and $Q_{i\alpha,j\beta} = L$ when there is an edge between the pair $(i,\alpha)$ and $(j,\beta)$.

The minimum energy configuration enforces $x_{i\alpha} = 1$ if and only if $V_{i\alpha}$ belongs to the maximum independent set and $x_{i\alpha} = 0$ otherwise. Equation 2 is a well know NP-hard problem which requires tremendous amount of computation time as L grows.

In the following, Equation 2 is modified to apply to adiabatic quantum computation for a quantum Ising Model.

Let X $$\text{where } X = \begin{pmatrix} x_1 \\ x_2 \\ x_3 \\ \vdots \\ x_N \end{pmatrix}$$

be a column vector of N Boolean variables and Q is a N×N matrix such that, then Equation 2 can be rewritten as the following Equation 3.

$$X_{opt} = \operatorname{argmin} X^\dagger Q X \text{ where } x_i \in \{0,1\}. \quad \text{[Equation 3]}$$

On the other hand, quantum mechanical Ising problem is formulated as the following Equation 4 by applying the relation of $S = 2X - 1$ to the Equation 3.

$$S_{opt} = \operatorname{argmin}\{S^\dagger J S + h^\dagger S\} \text{ where } S_i \in \{-1, 1\}. \quad \text{[Equation 4]}$$

The S variables are called quantum-mechanical spin. This quantum Ising model can be solved by one particular model of quantum computation called adiabatic quantum computation (AQC).

In quantum mechanics, the spin states $S = \pm 1$ are represented by orthogonal vectors in Hilbert space denoted as qubits. The two state of qubits are described by vectors as the following Equation 5.

$$|0\rangle = \begin{pmatrix} 1 \\ 0 \end{pmatrix} \text{ and } |1\rangle = \begin{pmatrix} 0 \\ 1 \end{pmatrix}. \quad \text{[Equation 5]}$$

The qubits can be extended to a vector by a linear combination called superposition, and this process is expressed as Equation 6.

$$|\phi\rangle = \alpha|0\rangle + \beta|1\rangle \text{ with } |\alpha|^2 + |\beta|^2 = 1. \quad \text{[Equation 6]}$$

Larger quantum systems are constructed through tensor product of the individual qubit vector spaces, for example, as the following Equation 7.

$$|01\rangle = |0\rangle \otimes |1\rangle = \begin{pmatrix} 0 \\ 1 \\ 0 \\ 0 \end{pmatrix}. \quad \text{[Equation 7]}$$

Superpositions of N qubit states are also possible with the associated amplitudes representing the probability of observing the respective N spin state.

We also define single qubit operators can be defined as the following Equation 8.

$$I = \begin{pmatrix} 1 & 0 \\ 0 & 1 \end{pmatrix} \text{ and } \sigma^z = \begin{pmatrix} 1 & 0 \\ 0 & -1 \end{pmatrix}. \quad \text{[Equation 8]}$$

If the operator of Equation (8) is applied to the qubit vector of Equation (5), the following Equation (9) can be obtained.

$$\sigma^z|0\rangle = |0\rangle, \sigma^z|1\rangle = -|1\rangle. \quad \text{[Equation 9]}$$

On 2-qubit state, an operator $\sigma^z \otimes I$ extracts the classical spin of the first qubit, $I \otimes \sigma^z$ extracts the classical spin of the second qubit and $\sigma^z \otimes \sigma^z$ extracts the product of the two classical spins.

The quantum-mechanical Ising model on N spins is represented as $2^N \times 2^N$ Hamiltonian represented as the following Equation 10.

$$H_I = \sum_{i,j} J_{ij} \sigma_i^z \sigma_j^z + \sum_i h_i \sigma_i^z, \quad \text{[Equation 10]}$$

where $\sigma_i^z$ is an operator $\sigma^z$ acting on $i^{th}$ qubit.

To initialize the quantum system, another kind of spin operator $\sigma^x$ can be defined as shown in Equation 11.

$$\sigma^x = \begin{pmatrix} 0 & 1 \\ 1 & 0 \end{pmatrix} \quad \text{[Equation 11]}$$

The spin operator of Equation 11 can flip the state of the qubit.

At this time, the ground state Hamiltonian can be expressed by following Equation 12 using a spin operator acting on the $i^{th}$ qubit.

$$H_0 = \Delta \sum_i \sigma_i^x. \quad \text{[Equation 12]}$$

The eigenstate of the ground state Hamiltonian of Equation 12 can be expressed as following Equation 13.

$$|\Phi\rangle_0 = \bigotimes_i \left( \frac{|0\rangle_i - |1\rangle_i}{\sqrt{2}} \right).$$ [Equation 13]

The time dependency of the quantum state of Equation 13 can be expressed by the Schrödinger equation of Equation 14.

$$i\hbar \frac{\partial}{\partial t} |\Psi(t)\rangle = H(t) |\Psi(t)\rangle.$$ [Equation 14]

To solve the quantum mechanical eigen modeling adiabatically, the convex form of the adiabatic Hamiltonian is obtained by using the initial condition given by $|\Psi(0)\rangle = |\Phi\rangle_0$ at t=0.

$$H(t) = \left(1 - \frac{t}{T}\right) H_0 + \frac{t}{T} H_I$$ [Equation 15]

At t=0, the quantum system has the lowest energy state. At this time, the lowest energy state can give equal probability for all classical configurations. On the other hand, at t=T, it is designed to cope with the quantum mechanical Ising model problem to solve the artificial visual problem.

In this way, the NP-hard problem, which is difficult to classically handle, can be solved through quantum mechanical adiabatic evolution of a given quantum system.

The globally lowest classical configuration obtained by adiabatic quantum mechanics (AQC) can be a solution to the second-order, non-definite binary optimization problem, which is a complex computational problem related to artificial view. It has been mathematically proved that quantum computing can provide exponential speed-up in solving NP-hard problems compared to classical methods.

The process of training the adiabatic quantum computing system to solve the secondary unrestricted binary optimization problem defined by Equation 2 begins with hardware training using a classification algorithm. The classification algorithm is expressed by the following equation 16.

$$y = \text{sign}\left( \sum_{i=1}^{N} \omega_i h_i(x) \right),$$ [Equation 16]

where $x \in R^M$ are input patters to be classified, $y \in \{-1, 1\}$ is the output of the classifier, $h_i: R^M \mapsto \{-1, 1\}$ are feature detectors, and $\omega_i \in \{0, 1\}$ is the weights to be optimized during training.

The training is achieved by solving the discrete optimization problem expressed as the following Equation 17.

$$\omega_{opt} =$$ [Equation 17]

$$\operatorname*{argmin}_{\omega}\left( \omega^\dagger \left( \frac{1}{N^2} \sum_{s=1}^{S} h(x_s) h(x_s)^\dagger \right) \omega + \omega \left( \lambda I - 2 \sum_{s=1}^{S} \frac{h(x_s)}{N} y_s \right) \right).$$

Here, the above Equation 17 is described for S-number of training samples $\{(\underline{x}_s, y_s) | s = 1, 2, \ldots, S\}$.

Hereinafter, a hardware implementation for solving the machine vision problem and a mathematical expression for describing the hardware will be described. In this example, such hardware is implemented using an orbital qubit of a silicon (Si) quantum dot.

Figure 2:
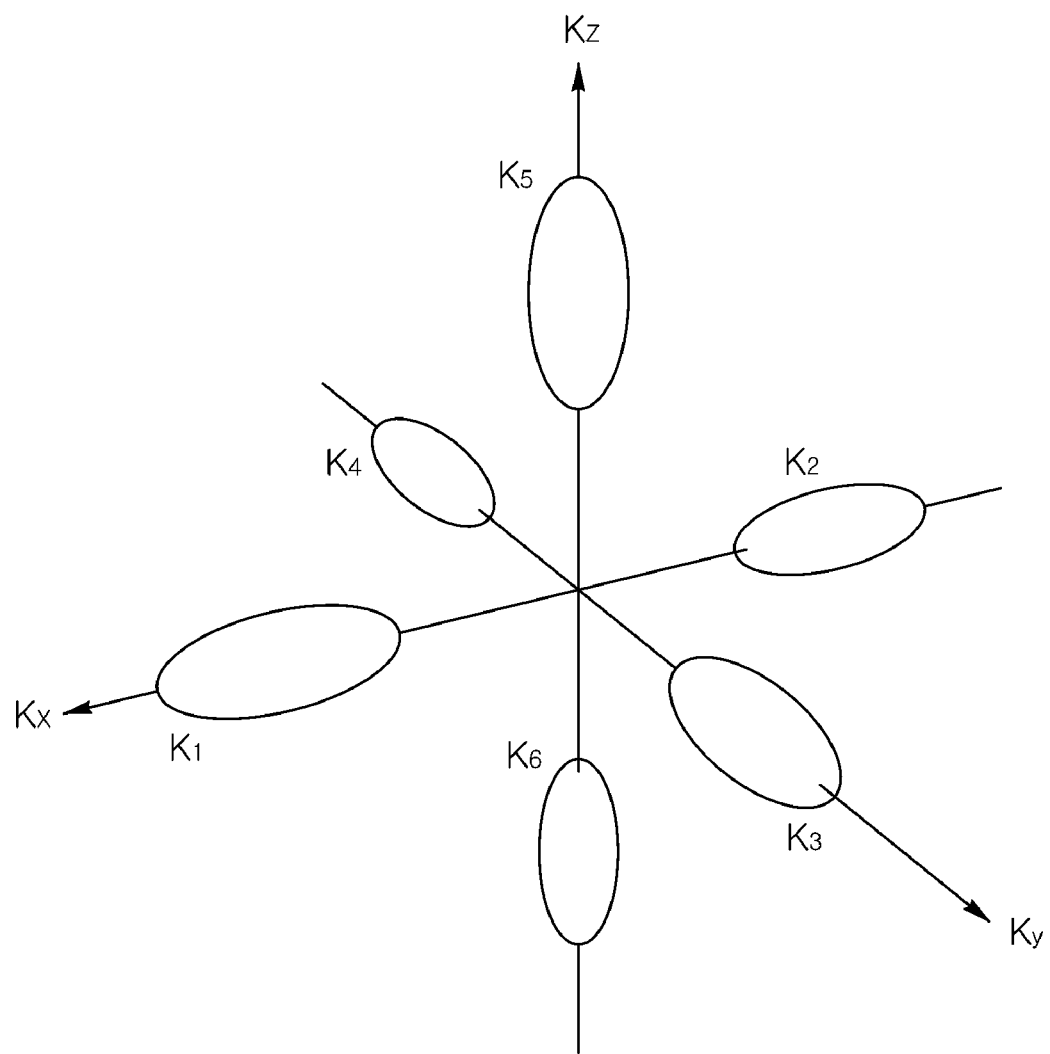
FIG. 2 shows the lowest conduction band of an ideal silicon (Si) crystal with six equivalent minima of ellipsoidal shape along [100] direction.

FIG. 2 shows the lowest conduction band of an ideal silicon (Si) crystal with six equivalent minima of ellipsoidal shape along [100] direction.

Referring to FIG. 2, at the minimum conduction band of the silicon crystal along the [001] direction, there are six eigenvalues expressed as ellipsoids, referred to as 'valleys'. Thus, the entire wave function can be represented by a linear combination of these six eigenstates. When the structure is formed with a specific quantum dot structure, the translational symmetry breaks and each valley state is combined to each other.

If the direction of the electric field due to the upper gate and the [001] direction of the silicon crystal are set to be the Z axis, the fifth valley parallel to the Z axis of FIG. 2 and the sixth valley are combined, it is expressed as $$|\Psi\rangle \cong \frac{1}{\sqrt{2}} (|F_5\rangle \pm |F_6\rangle).$$

$F_5$ and $F_6$ represent the orbital functions of the 5$^{th}$ and 6$^{th}$ valleys, respectively. These orbitals satisfy the Hamiltonian as shown in Equation 18 below.

$$H = \begin{vmatrix} \varepsilon_0(F) & \Delta(F) \\ \Delta(F) & \varepsilon_1(F) \end{vmatrix},$$ [Equation 18]

where $\varepsilon_0$ and $\varepsilon_1$ are the energy levels of symmetric and anti-symmetric states, respectively, $\Delta$ is the intervalley splitting, and F is an external electric field along the z-direction. To derive the effective Hamiltonian of Equation 18, we used the multi-valley effective mass Hamiltonian to calculate the intervalley polarized electron state. The wave function is written as the following Equation 19.

$$\Psi_{S,A} = \frac{1}{\sqrt{2}} \begin{pmatrix} 1 \\ \pm 1 \end{pmatrix} \varphi_{S,A}(\vec{r}) = \chi_{S,A} \varphi_{S,A}(\vec{r}),$$ [Equation 19]

where $\varphi_{S,A}(\vec{r})$ are the orbital wave functions and $\chi_{S,A}$ are the pseudo-spins for the symmetric and anti-symmetric state, respectively.

The valley splitting may be expressed as following Equation 20.

$$\Delta(F) \approx$$ [Equation 20]

$$2 \left| \int d\vec{r} \exp(-2iK_o z) |\Psi_0(\vec{r})|^2 \left( 1.045 V(\vec{r}) + \frac{0.414}{K_0} \frac{\partial V(\vec{r})}{\partial z} \right) \right|,$$

where $K_0 = 0.85 \times 2\pi / a$, a is the silicon lattice constant, $\Psi_0$ is the ground state of a single valley, and $V(\vec{r}) = V_C(\vec{r}) + eFz$ with $V_C$ the QD confinement potential and F the applied electric field. We note that $$\frac{\partial V_C(\vec{r})}{\partial z} = \Delta E_C \delta(z - z_i(x, y))$$

where $\Delta E_C$ is the conduction band discontinuity and $z_i$ is the QD interface. The detection of orbital qubit state would be simpler than that of the spin qubit and would require the charge detector.

Hereinafter, a structure for detecting an orbital qubit will be described.

Figure 3:
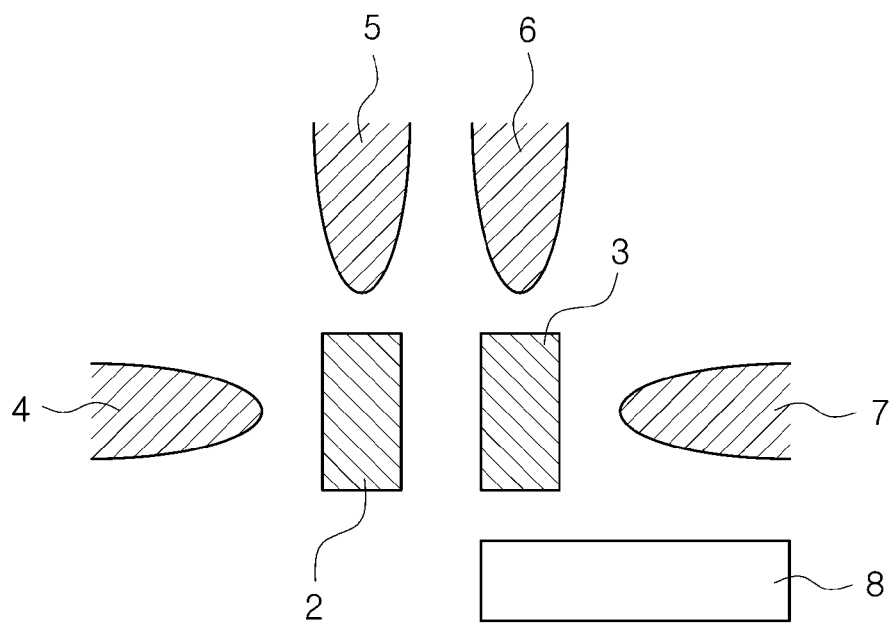
FIG. 3 is a schematic diagram of silicon quantum dot orbital single qubit system.
Figure 4:
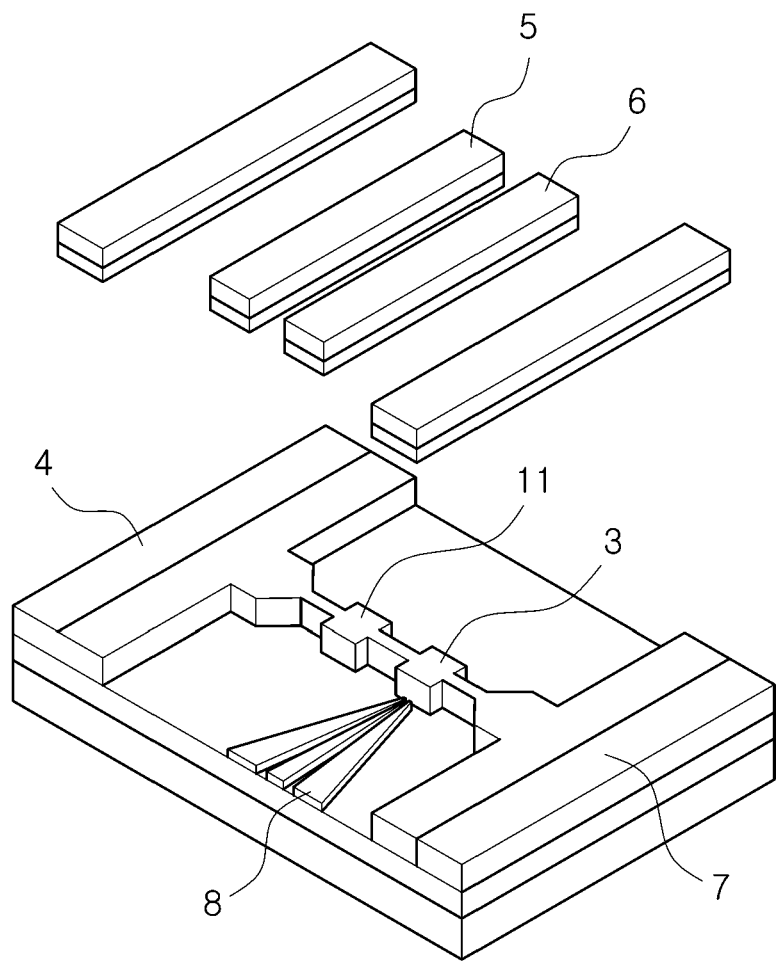
FIG. 4 is a schematic structure of the silicon quantum dot orbital single qubit system shown in FIG. 3.

FIG. 3 is a schematic diagram of silicon quantum dot orbital single qubit system, and FIG. 4 is a schematic structure of the silicon quantum dot orbital single qubit system shown in FIG. 3.

Referring to FIG. 3 and FIG. 4, it is assumed that there is one electron in the first quantum dot 2 and no electrons in the second quantum dot 3. After a while, the electron in the first quantum dot 2 becomes zero state (for example, a spin-up state) or a one state (for example, a spin-down state). Assuming that a magnetic field is applied to the entire device in the [001] direction and an electric field is applied to the electrons of the first quantum dot 2 through a first electrode 4, the two quantum states are superposed on each other according to the application time of the electric field. A negative voltage is applied to the second electrode 6 to prevent the electrons of the first quantum dot 2 from tunneling to the second quantum dot 3. The voltage of the third electrode 5 and the fourth electrode 7 may be adjusted for electrons to tunnel to the second quantum dot 3. Therefore, the tunneling of electron in the first quantum dot 2 and the second quantum dot 3 is controlled by the second electrode 6, the third electrode 5 and the fourth electrode 7.

The electrons tunneled to the second quantum dot 3 can be measured by a detector 8 to confirm its state.

Figure 5:
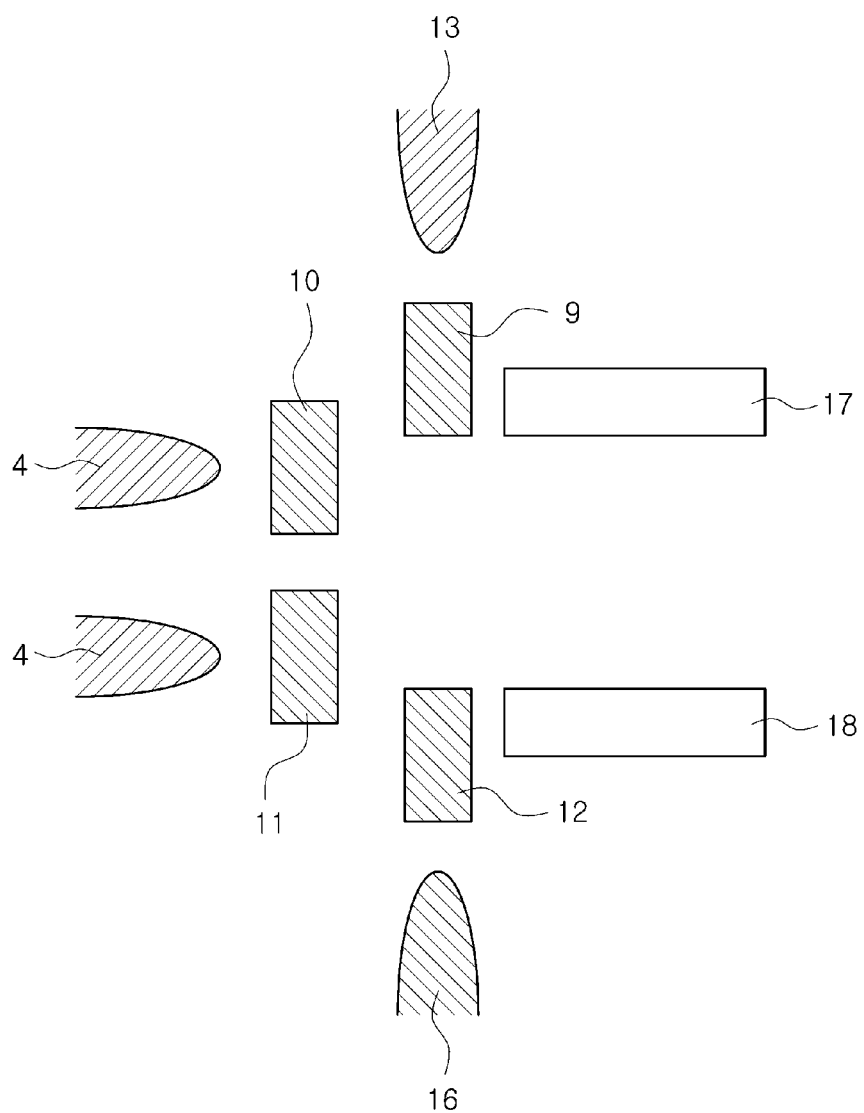
FIG. 5 is a schematic diagram of silicon quantum dot orbital two qubits system.
Figure 6:
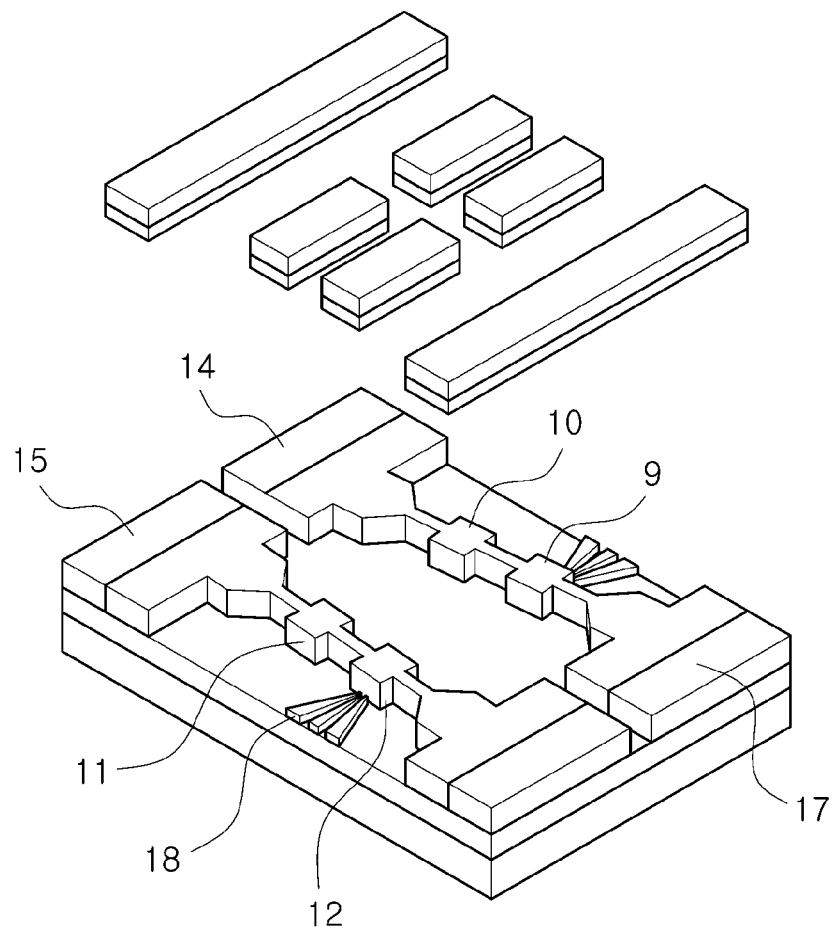
FIG. 6 is a schematic structure of the silicon quantum dot orbital two qubits system shown in FIG. 5.

FIG. 5 is a schematic diagram of silicon quantum dot orbital two qubits system, and FIG. 6 is a schematic structure of the silicon quantum dot orbital two qubits system shown in FIG. 5.

Referring to FIG. 5 and FIG. 6, as described above regarding to the single qubit system, one electron is inserted into each of the first quantum dot 10 and the second quantum dot 11 and an appropriate voltage is applied to the first electrode 14 and the second electrode 15 to form a two qubits system.

Unlike the single qubit system, electron-electron interaction exists between the first quantum dot 10 and the second quantum dot 11. The electron-electron interaction is highly interactive when the two electrons are in a bonding state rather than in an anti-bonding state.

The two qubits system is implemented by controlling the voltage magnitude and the application time to be applied to the first electrode 14 and the second electrode 15. The two qubits system makes electron in the first quantum dot 10 tunnel to the third quantum dot 9 by using the third electrode 13 and detects it through the first detector 17, and makes electron in the second quantum dot 11 tunnel to the fourth quantum dot 12 by using the fourth electrode 16 and detects it through the second detector 18.

Hamiltonian describing the electrons trapped in the first quantum dot 10 and the second quantum dot 11 is represented by Equation (21) below.

$$H_{12} = \begin{bmatrix} E_{11} & 0 & 0 & 0 \\ 0 & E_{10} & E_c & 0 \\ 0 & E_c & E_{01} & 0 \\ 0 & 0 & 0 & E_{00} \end{bmatrix},$$ [Equation 21]

where the coupling energy $E_C$ arises from the inter-dot Coulomb interaction and is given by $E_C = \langle 01|V_{ij}|10\rangle$. If we assume that the Coulomb interaction is negligible and control energies by the bias voltage such that $E_{11} = E_{00} = -E_{10} = -E_{01} = J_{12}$, then the Hamiltonian can be put into the following Ising form as Equation 22.

$$H = J_{12}(t)\sigma_1^z \sigma_2^z + h_1 \sigma_1^z + h_2 \sigma_2^z$$ [Equation 22]

In this equation, $J_{12}(t)$ is controlled by an external bias.

On the other hand, Hamiltonian regarding to N orbital qubits can be described by the following equation 23.

$$H_I = \sum_{i<j} J_{ij} \sigma_i^z \sigma_j^z + \sum_i h_i \sigma_i^z$$ [Equation 23]

In Equation 23, $J_{ij}$ and $h_i$ are variables having a positive value, and are changed as the external power source is applied. The bias voltage applied to the gate can be appropriately adjusted to calculate the Hamiltonian of the quantum processing processor.

Hamiltonian at the initial (t=0) is $J_{ij}=0$ for all i and j. In Equation 15, the T value is defined as $T=h/\Delta E$, and $\Delta E$ is the interval between the initial ground state and the global minimum energy.

Figure 7:
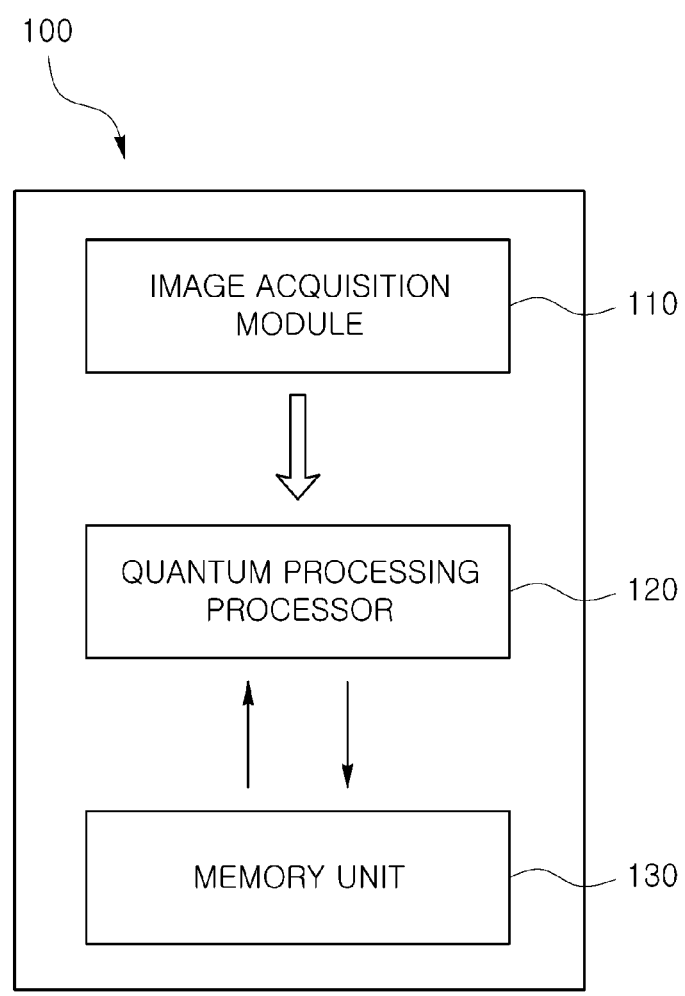
FIG. 7 is a block diagram showing an orbital qubit based quantum mechanical machine vision system in accordance with an exemplary embodiment of the present invention.

FIG. 7 is a block diagram showing an orbital qubit based quantum mechanical machine vision system in accordance with an exemplary embodiment of the present invention.

Referring to FIG. 7, an orbital qubit based quantum mechanical machine vision system 100 according to an exemplary embodiment of the present invention may include an image acquisition module 110, a quantum processing processor 120 and a memory unit 130.

The image acquisition module 110 acquires an image. The image acquisition module 110 may include, for example, a CCD camera.

The quantum processing processor 120 processes the image obtained from the image acquisition module 110.

The memory unit 130 stores data necessary for the computation of the quantum processing processor 120.

The quantum processing processor 120 obtains a first labeled graph connecting between feature points of the first image and a second labeled graph connecting feature points of the second image, generates a point-to-point combination by matching the feature points of the first image with the feature points the second image, generates a conflict graph by adding the largest point-to-point combination by comparing the point-to-point combinations with the threshold, generates non-constrained binary optimization equation for finding a maximum independent set of conflict graphs, converts the non-constrained binary optimization equation into Ising model of the quantum system, and calculates the Hamiltonian of Ising model based on an orbital qubit to obtain solution of the non-constrained binary optimization equation. The quantum processing processor 120 may learn repeatedly the non-constrained binary optimization equation through machine learning.

For example, as described above referring to FIG. 2 through FIG. 6, quantum processing processor 120 may use two eigenstate in six eigenstates in the minimum conduction band of silicon (Si) crystal, the two eigenstate being opposite to each other, in calculating the Hamiltonian of Ising model based on orbital qubit to obtain solution of the non-constrained binary optimization equation. In this case, the two eigenstate may be along a direction of silicon crystal.

Meanwhile, in calculating the Hamiltonian of Ising model based on the orbital qubits 121 to obtain solution of the non-constrained binary optimization equation, the Hamiltonian of Ising model can be calculated through adiabatic evolve. This process has been described in detail above, so redundant description is omitted.

As described above, according to the orbital qubit-based quantum mechanical machine vision system and an arithmetic operation method of the present invention, the NP problem generated as the number of feature points increases is replaced by Hamiltonian using Ising model, so that it can be easily calculated using orbital qubits arranged in a matrix shape.

It will be apparent to those skilled in the art that various modifications and variation may be made in the present invention without departing from the spirit or scope of the invention. Thus, it is intended that the present invention cover the modifications and variations of this invention provided they come within the scope of the appended claims and their equivalents.

What is claimed is:

1. A quantum mechanical arithmetic operation method based on orbital qubits, the quantum mechanical arithmetic operation method being performed by a quantum processing processor in a quantum system, the quantum mechanical arithmetic operation method comprising: obtaining a first labeled graph connecting between feature points of a first image and a second labeled graph connecting feature points of a second image; generating a point-to-point combination by matching the feature points of the first image with the feature points of the second image; generating a conflict graph by adding the largest point-to-point combination by comparing the point-to-point combinations with a threshold; generating a non-constrained binary optimization equation for finding a maximum independent set of conflict graphs; converting the non-constrained binary optimization equation for finding a maximum independent set of conflict graphs into an Ising model of the quantum system; and calculating a Hamiltonian of the Ising model based on an orbital qubit to obtain a solution of the non-constrained binary optimization equation.

2. The quantum mechanical arithmetic operation method of claim 1, wherein calculating the Hamiltonian of the Ising model based on the orbital qubit to obtain the solution of the non-constrained binary optimization equation is performed by two eigenstates in six eigenstates in a minimum conduction band of silicon (Si) crystal, the two eigenstates being opposite to each other.

3. The quantum mechanical arithmetic operation method of claim 2, wherein the two eigenstate are along a [001] direction of silicon crystal.

4. The quantum mechanical arithmetic operation method of claim 1, wherein the Hamiltonian of the Ising model is calculated through adiabatic evolve, in calculating the Hamiltonian of the Ising model based on the orbital qubit to obtain the solution of the non-constrained binary optimization equation.

5. The quantum mechanical arithmetic operation method of claim 1, further comprising:
repeatedly learning the non-constrained binary optimization equation through machine learning.

6. A quantum mechanical machine vision system comprising: an image acquisition module to acquire an image; a quantum processing processor to process the image obtained from the image acquisition module; and a memory unit to store data necessary for computation of the quantum processing processor; wherein the quantum processing processor, obtains a first labeled graph connecting between feature points of a first image and a second labeled graph connecting feature points of a second image, generates a point-to-point combination by matching the feature points of the first image with the feature points the second image, generates a conflict graph by adding the largest point-to-point combination by comparing the point-to-point combinations with a threshold, generates a non-constrained binary optimization equation for finding a maximum independent set of conflict graphs, converts the non-constrained binary optimization equation for finding a maximum independent set of conflict graphs into an Ising model of the quantum mechanical machine vision system, and calculates a Hamiltonian of the Ising model based on an orbital qubit to obtain a solution of the non-constrained binary optimization equation.

7. The quantum mechanical machine vision system of claim 6, wherein the quantum processing processor uses two eigenstate in six eigenstates in the minimum conduction band of silicon (Si) crystal, the two eigenstate being opposite to each other.

8. The quantum mechanical machine vision system of claim 7, wherein the two eigenstate are along a [001] direction of silicon crystal.

9. The quantum mechanical machine vision system of claim 6, wherein the quantum processing processor calculates the Hamiltonian of the Ising model through adiabatic evolve.

* * * * *